May 10, 1960 R. EMEIS ET AL 2,936,410
SILICON POWER TRANSISTOR
Filed March 25, 1959
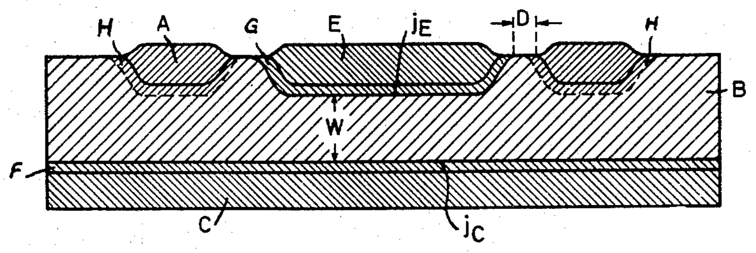

United States Patent Office 2,936,410

Patented May 10, 1960

2,936,410

SILICON POWER TRANSISTOR

Reimer Emeis, Ebermannstadt, Oberfranken, and Adolf Herlet, Pretzfeld, Oberfranken, Germany, assignors to Siemens-Schuckertwerke Aktiengesellschaft, Berlin-Siemensstadt, Germany, a corporation of Germany Application March 25, 1959, Serial No. 801,935

Claims priority, application Germany March 27, 1958

4 Claims. (Cl. 317—235)

Our invention relates to a power transistor with a monocrystalline semiconductor plate of silicon which possesses at least two heavily doped relatively large regions of a given conductance type to serve as emitter and collector respectively, and between these a less heavily doped base region of the opposite conductance type directly bordering the two other areas at respective p-n junctions. The collector covers an essential portion of the surface on one flat side of the plate, while the emitter and at least one base contact are disposed on the other flat side of the plate so as to leave vacant between each other a uniformly wide strip on the plate surface.

Such power transistors are known as a special type of so-called n-p-n or p-n-p power transistors for use as amplifiers or switching transistors in power circuits with currents from about 1 amp. up to the order of magnitude of 100 amps. These power transistors are distinct from transistors for signal transmission whose output circuits carry only very slight currents of less than 1 amp., in most cases only a few milliamps. The emitters of transistors for communication purposes are often provided with point contacts of less than 0.1 mm.$^2$ contacting area, or with edge or tip contacts without any appreciable area. Design and dimensioning of such communication-signal transmitting devices are directed mainly toward stability and control of highest possible frequencies, in contrast to power transistors whose design and dimensioning is based upon other requirements. Among these is avoidance of an excessive current density which prohibits providing the emitter with a point or edge contact. Consequently, the term "power transistors" in the sense of the foregoing explanation is understood in this specification to relate to semiconductor triodes with an emitter covering a semiconductor area of approximately 1 mm.$^2$ or more.

It is an object of our invention to improve silicon power transistors of the above-mentioned type with respect to its efficiency for use as a switching device of high current controlling duty or for use as a current amplifier of improved power amplification. Another, more specific object is to increase the peak inverse voltage of the collector-adjacent p-n junction while simultaneously securing highest possible current amplification.

According to our invention, we provide in a silicon power transistor of the type described a given ratio of the active width of the relatively weakly doped base region to the width of the vacant space remaining on the surface of the silicon monocrystal between the base contact and the emitter areas or contacts; and we also keep the dimensions of the just-mentioned thickness and width within certain numerical limits.

Generally, the thickness of the base region between the emitter and collector is between approximately 0.02 and 0.08 mm., and the width of the strip zone on the silicon surface between emitter and base contact is at most twice the just-mentioned thickness but not less than 0.025 mm. More specifically, in a n-p-n type power transistor according to the invention, the thickness of the base region between emitter and collector is about 0.03 to 0.08 mm.; and in p-n-p type power transistors, the thickness of the base region is about 0.02 to 0.05 mm.

We have found that the just-mentioned values are critical for best performance of silicon power transistors as will be explained below with reference to the drawing illustrating on enlarged scale a cross section of a power transistor element in schematical representation.

While the illustration applies to n-p-n transistors as well as to p-n-p transistors, assume that an n-p-n transistor is involved. The transistor is produced from a circular disk of monocrystalline p-type silicon in accordance with the known alloying method. Produced on the bottom side of the circular disk is a collector C by alloying an antimony-containing gold foil together with the silicon. The gold foil may contain 99% gold and 1% antimony. The collector C, when completed, consists of a layer of a metallically conducting antimony-containing gold-silicon alloy which is bordered by a heavily doped n-conducting zone F. The zone F extends up to the collector-adjacent p-n injunction $j_C$. The collector C covers the entire surface on the bottom side of the silicon disk.

On the opposite side, a circular emitter E is alloyed into the silicon body in the same manner and with the same substances as described above. The emitter zone extends down to the emitter-adjacent p-n junction $j_E$. The emitter area covers a surface portion of smaller radius than the collector C and is surrounded by a ring-shaped base contact A produced by alloying into the silicon body a foil of aluminum and thus consisting of an aluminum-silicon alloy (silumin). The base contact A forms a barrier-free contact for the remaining portion of the silicon body which remained unaffected by the alloying process and which is designated as base region B. The thickness of the base region B between the emitter area E and the collector area C is denoted by W. Located between base contact A and base region B is a heavily p-doped layer H of slight thickness which is hereinafter neglected because its boundary with the low-doped base region is not accurately determinable at the finished transistor element. Since any boundary effect of layer H can make itself felt only by a more favorable operational behavior of the transistor, such neglect is not objectionable. Accordingly, the distance denoted by D is considered to define the spacing between the emitter and the base contact on the semiconductor surface. The transistor when in "open" condition, is assumed to operate mainly in the range of "high injection."

According to the co-pending application Serial No. 749,706, filed July 21, 1958 by Adolf Herlet and assigned to the assignee of the present invention, the thickness W of the base region is to be chosen within the range of 0.04 and 0.07 mm. in order to obtain an inverse blocking voltage of several hundred volts together with a sufficiently large amplification factor. However, the current amplifying factor is undesirably reduced in n-p-n transistors if the ratio of the thickness W of the base region to the diffusion length L exceeds the value $W/L \cong 1$. In the n-p-n silicon power transistors with alloyed electrodes previously produced, an effective diffusion length L up to 0.2 mm. is obtainable with a plate thickness of about 0.12 mm. for median values of carrier injection. It has been discovered, however, that the value of L, when operating with increased carrier concentrations, again declines from the above-mentioned maximum of up to 0.2 mm. and assumes much smaller values. For that reason, if one continuously increases the current flowing from emitter to collector, a critical limit is reached at which the value of L becomes smaller than the thickness W of the base region and at which, therefore, the current amplification becomes too slight for practical purposes. In the range used according to the invention for the base-region thickness, namely between 0.03 and 0.08 mm. in n-p-n power transistors, such danger of reducing the current amplification is avoided because the practically available possibilities of cooling the transistor will anyhow place a limit upon the magnitude of the current flowing from the emitter to the collector, so that the diffusion length L does not drop below the mentioned critical value.

The above-mentioned numerical values apply to n-p-n power transistors. In contrast, p-n-p power transistors place stricter requirements upon the optimum ratio $W/L$, due to the smaller mobility of the minority charge carriers in the base region. Thus, instead of the above given limit value $W/L \cong 1$ for sufficient current amplification in a p-n-p transistor, the corresponding limit ratio for p-n-p transistor is smaller, namely $W/L \cong 1/\sqrt{3}$. Consequently, for obtaining an approximately equally high current amplification at the same diffusion length L, the thickness W of the base region in a p-n-p transistor must amount only to approximately 0.6 times the value given above for n-p-n transistors. Accordingly, in p-n-p transistors the range of optimum thickness for the base region is 0.02 to 0.05 mm.

In conjunction with the foregoing consideration applied to the optimum thickness W of the base region, the dimensioning of the width D of the spacing strip between emitter and base contact must satisfy the requirements explained presently.

These requirements concern (*a*) the charge-carrier losses and hence the current amplification factor, (*b*) the highest permissible blocking voltage (peak inverse voltage) between emitter and base contact, and (*c*) the voltage drop in the forward direction between emitter and base contact.

(*a*) In the range $D > 2L$ the carrier losses are probably approximately constant. In contrast thereto, the carrier losses at first become gradually smaller as the spacing D is progressively reduced below the amount 2L. Consequently, the current amplification factor increases accordingly. However, if the spacing D is made small in comparison with the base thickness W, the carrier losses in the base region between emitter and collector become preponderant. For that reason, it becomes useless to make the distance D smaller than 0.025 mm. The same value also constitutes a lower limit with respect to manufacturing difficulties arising from the alloying method by means of which the base contact and emitter areas are produced on the silicon body.

(*b*) For many applications, it is further desired that a highest possible voltage can be applied in the inverse (blocking) direction between emitter and base without thereby causing an appreciable current to flow in the reverse direction. The highest permissible voltage between emitter and base decreases noticeably if the spacing D is diminished below one half of the value of the base thickness W. However, an increase in the spacing D beyond the amount 0.5W affords practically no advantage because then the highest permissible blocking voltage (peak inverse voltage) is limited by the Zenner effect.

(*c*) It has furthermore been observed that the voltage drop in the forward direction increases very steeply if, and the more, the spacing W exceeds twice the amount of the diffusion length D. For that reason, the width D of the spacer zone between emitter and base contact is preferably not made larger than 2W, in order to prevent the voltage loss to become excessive at high current density at which L becomes approximately equal to W.

On the basis of the observations and conceptions reported above under (*a*) to (*c*), and also considering the otherwise occurring manufacturing difficulties, the width D of the strip-shaped zone between emitter and base contact is most advantageously between 0.05 and 0.1 mm.

The manufacture of silicon power transistor elements according to the present invention is preferably carried out by assembling a monocrystalline silicon disk with metal foils that are placed against the opposite flat sides of the disk. The assembly is then embedded in a neutral powder, for example graphite, and the whole assembly is pressed together under mechanical pressure which causes the embedding powder to become compacted to a mold accurately matching the embedded components. The compressed assembly is then heated to a temperature of 700 to 800° C. for a short period of time, for example a few minutes, and is thereafter permitted to slowly cool to normal room temperature (20° C.). This method is more fully described in the co-pending application of R. Emeis, Serial No. 637,029, filed January 29, 1957 and assigned to the assignee of the present invention.

An example of data relating to a n-p-n silicon power transistor according to the invention and made as described above, will be given presently. The transistor, designed as shown on the drawing, comprised a silicon disk of 10 mm. diameter and 0.1 mm. thickness. Its specific resistance was 100 Ω cm. The highly doped zones H, F were 0.01 mm. thick and, after completion of the alloying process, had a charge carrier concentration of $10^{19}$ cm.$^{-3}$. The collector C was 0.035 mm. thick.

The electrical data were found to be as follows. With a base current $i_B$ of 300 milliamps and a collector current $i_C$ of approximately 3 to 5 amps. (saturation current), the transistor exhibited at an electrode spacing $D = 0.2$ mm. a loss voltage $U_{CE}$ of about 1.5 to 2 volts between collector and emitter. However, with spacing D made equal to approximately 0.05 to 0.075 mm. in accordance with the invention, the loss voltage $U_{CE}$ was found to be reduced to about 0.6 to 0.7 volts, all dimensions and current values remaining as described above. By virtue of the greatly reduced loss voltage, the transistor can be operated with a higher collector current $i_C$ than heretofore feasible for the same thermal loading.

The invention is not only applicable to ring-shaped base contacts and emitter areas but can be used also for transistors with a silicon body of rectangular shape whose electrodes form a comb-shaped pattern of straight strips.

We claim:

1. A power transistor comprising a plate of monocrystalline silicon having heavily doped emitter and collector areas of a given conductance type and a less heavily doped base region of the opposite conductance type located between said respective emitter and collector areas and forming respective p-n junctions therewith, said collector area covering substantially one side of said plate, a base contact and said emitter area being located beside each other on the other side of said plate and leaving vacant between each other a uniformly wide strip zone on the surface of said plate, said base region having between said emitter and collector areas a thickness between about 0.02 and 0.08 mm., and the width of said strip zone being at most twice said thickness of said base region but not less than 0.025 mm.

2. In a power transistor according to claim 1, the width of said strip zone between emitter and base contact being 0.05 to 0.1 mm.

3. A power transistor comprising a plate of monocrystalline silicon having heavily doped emitter and collector areas of n-type conductance and a less heavily doped base region of p-type conductance located between said respective emitter and collector areas and forming respective p-n junctions therewith, said collector area covering a substantial portion on one side of said plate, a base contact and said emitter area being located beside each other on the other side of said plate and leaving vacant between each other a uniformly wide strip zone on the surface of said plate, said base region having between said emitter and collector areas a thickness of about 0.03 to 0.08 mm., and the width of said strip zone being at most twice said thickness of said base region but not less than 0.025 mm.

4. A power transistor comprising a plate of monocrystalline silicon having heavily doped emitter and collector areas of p-type conductance and a less heavily doped base region of n-type conductance located between said respective emitter and collector areas and forming respective p-n junctions therewith, said collector area covering a substantial portion on one side of said plate, a base contact and said emitter area being located beside each other on the other side of said plate and leaving vacant between each other a uniformly wide strip zone on the surface of said plate, said base region having between said emitter and collector areas a thickness of about 0.02 to 0.05 mm., and the width of said strip zone being at most twice said thickness of said base region but not less than 0.025 mm.

References Cited in the file of this patent

UNITED STATES PATENTS

| | | |
|---|---|---|
| 2,882,464 | Blais | Apr. 14, 1959 |
| 2,887,415 | Stevenson | May 19, 1959 |
| 2,897,295 | Zelinka | July 28, 1959 |